(12) United States Patent
Kim et al.

(10) Patent No.: US 10,282,289 B2
(45) Date of Patent: May 7, 2019

(54) PACKAGE MODULES AND METHODS OF TESTING OPERATIONS OF CHIPS INCLUDED THEREIN

(71) Applicant: SK hynix Inc., Icheon-si Gyeonggi-do (KR)

(72) Inventors: Hak Song Kim, Seoul (KR); Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/862,730

(22) Filed: Jan. 5, 2018

(65) Prior Publication Data

US 2019/0073294 A1    Mar. 7, 2019

(30) Foreign Application Priority Data

Sep. 4, 2017 (KR) .................. 10-2017-0112713

(51) Int. Cl.
| | | |
|---|---|---|
| G11C 7/00 | (2006.01) | |
| G06F 12/02 | (2006.01) | |
| G06F 3/06 | (2006.01) | |
| G11C 7/10 | (2006.01) | |
| G11C 16/26 | (2006.01) | |
| G11C 5/02 | (2006.01) | |
| G11C 16/04 | (2006.01) | |

(52) U.S. Cl.
CPC .......... *G06F 12/0246* (2013.01); *G06F 3/061* (2013.01); *G06F 3/0659* (2013.01); *G11C 5/025* (2013.01); *G11C 7/1063* (2013.01); *G11C 7/1069* (2013.01); *G11C 16/0483* (2013.01); *G11C 16/26* (2013.01)

(58) Field of Classification Search
CPC .... G06F 12/0246; G06F 3/061; G06F 3/0659; G11C 5/025; G11C 7/103; G11C 7/1069; G11C 16/0483; G11C 16/26
See application file for complete search history.

(56) References Cited

U.S. PATENT DOCUMENTS

| | | | | |
|---|---|---|---|---|
| 8,493,799 | B2 * | 7/2013 | Sung | .................. G11C 7/02 365/189.09 |
| 8,902,684 | B2 * | 12/2014 | Kwean | ................ G11C 29/023 365/194 |
| 9,218,861 | B2 * | 12/2015 | Lendvay | ................ G11C 8/12 |
| 9,268,500 | B2 * | 2/2016 | Im | ........................ G06F 3/0688 |
| 2014/0021978 | A1 | 1/2014 | Ikeda | |

FOREIGN PATENT DOCUMENTS

KR    1020120119532 A    10/2012

* cited by examiner

*Primary Examiner* — Pho M Luu
(74) *Attorney, Agent, or Firm* — William Park & Associates Ltd.

(57) ABSTRACT

A package module may be provided. The package module may include a first chip and a second chip. The first chip may be configured to receive first pattern data to generate first transmission data in a first write mode. The second chip may be configured to receive the first transmission data to generate and output first sense data in a first read mode.

20 Claims, 11 Drawing Sheets

PACKAGE MODULES AND METHODS OF TESTING OPERATIONS OF CHIPS INCLUDED THEREIN

CROSS-REFERENCE TO RELATED APPLICATIONS

The present application claims priority under 35 U.S.C. 119(a) to Korean Application No. 10-2017-0112713, filed on Sep. 4, 2017, which is incorporated herein by references in its entirety.

BACKGROUND

1. Technical Field

Embodiments of the present disclosure generally relate to package modules including a plurality of chips and methods of testing the chips included in the package modules.

2. Related Art

Each of package modules may include a plurality of chips that execute data communication therebetween. Each of the plurality of chips included in each package module may include a receiver for receiving data or signals and a transmitter for outputting the data or the signals. The receiver and the transmitter may be combined into a single transceiver.

SUMMARY

According to an embodiment, a package module may include a first chip and a second chip. The first chip may be configured to operate in a first write mode and receive pattern data. The second chip may be configured to operate in a first read mode and output first sense data. Whether the first chip has a normal transmitting function and the second chip has a normal receiving function is determined based on a comparison between the pattern data and the first sense data.

According to an embodiment, there is provided a method of testing operations of chips included in a package module. The method may include putting a first chip of the chips in a condition of a first write mode and a second chip of the chips in a condition of a first read mode, generating first transmission data from first pattern data inputted to the first chip, transmitting the first transmission data from the first chip to the second chip, and generating first sense data from the first transmission data inputted to the second chip to output the first sense data from the second chip.

According to an embodiment, there is provided a package module. The package module may include a first chip configured to operate in a write mode and receive pattern data. The package module may include a second chip configured to operate in a read mode and output sense data. Whether the first chip has a normal transmitting function and the second chip has a normal receiving function may be determined based on a comparison between the pattern data and the sense data.

According to an embodiment, there is provided a package module. The package module may include a first chip configured to operate in a write mode and receive a pattern strobe signal. The package module may include a second chip configured to operate in a read mode and output a sense strobe signal. Whether the first chip has a normal transmitting function and the second chip has a normal receiving function may be determined based on a comparison between the pattern strobe signal and the sense strobe signal.

According to an embodiment, there is provided a package module. The package module may include a first chip configured to receive a first pattern strobe signal to generate and transmit a transmission strobe signal in a first write mode. The package module may include a second chip configured to receive the transmission strobe signal to generate and output a sense strobe signal in a first read mode.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments are directed to package modules having a testability to transceivers included in chips thereof. Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
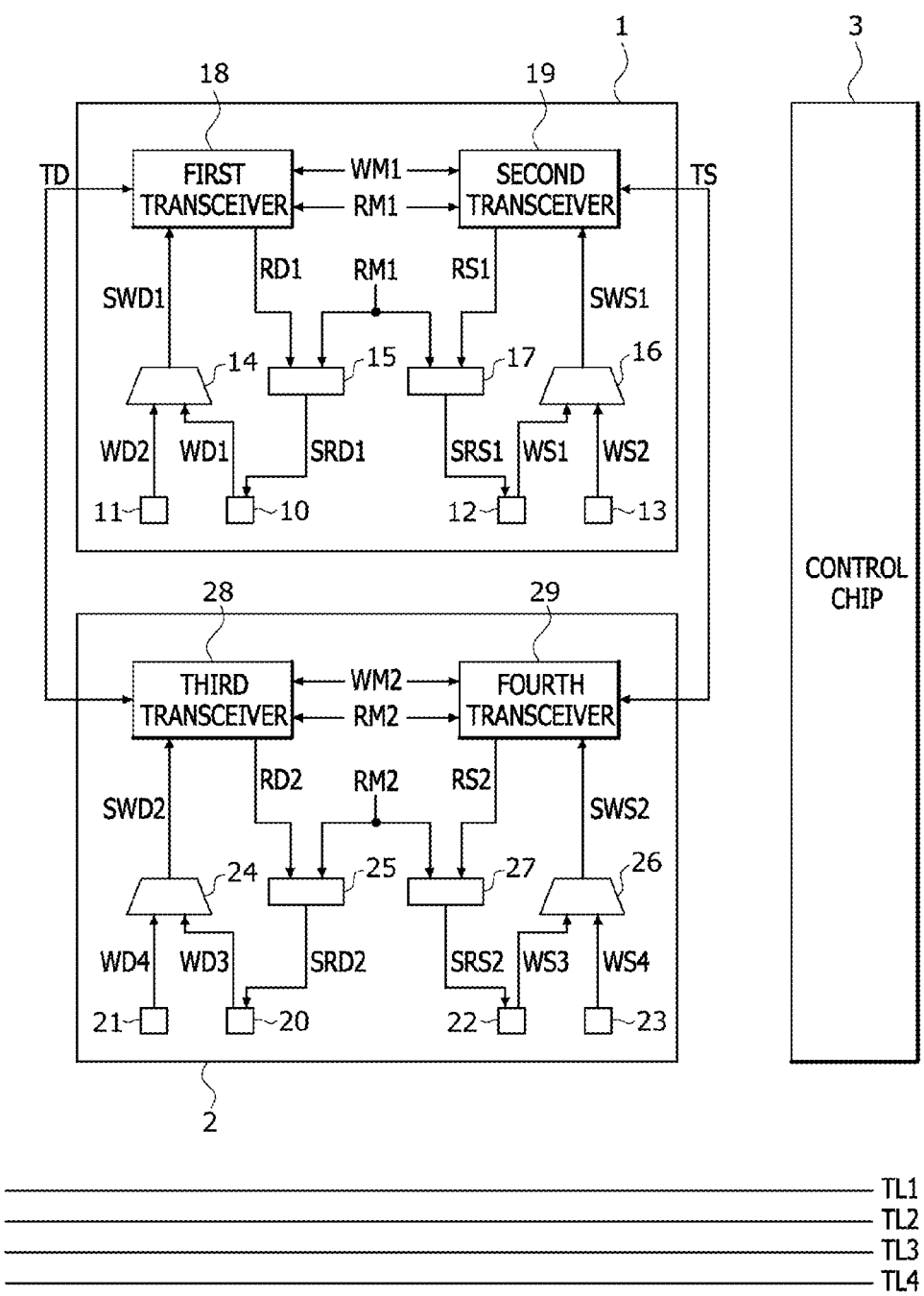
FIG. 1 is a block diagram illustrating a configuration of a package module according to an embodiment of the present disclosure.

Referring to FIG. 1, a package module according to an embodiment may include a first chip 1, a second chip 2, a control chip 3, a first transmission line TL1, a second transmission line TL2, a third transmission line TL3 and a fourth transmission line TL4.

The first chip 1 may include a first pad 10, a second pad 11, a third pad 12, a fourth pad 13, a first selection circuit 14, a first output circuit 15, a second selection circuit 16, a second output circuit 17, a first transceiver 18 and a second transceiver 19.

The first selection circuit 14 may generate first selection write data SWD1 in response to first write data WD1 and second write data WD2. The first selection circuit 14 may receive the first write data WD1 through the first pad 10 and may receive the second write data WD2 through the second pad 11, while the first chip 1 is in the write mode. The first selection circuit 14 may select and output the first write data WD1 as the first selection write data SWD1 if the first write data WD1 are inputted to the first selection circuit 14 while the first chip 1 is in the write mode. The first selection circuit 14 may select and output the second write data WD2 as the first selection write data SWD1 if the second write data WD2 are inputted to the first selection circuit 14 while the first chip 1 is in the write mode.

The first output circuit 15 may generate first selection read data SRD1 from first read data RD1 in response to a first read mode signal RM1. The first read mode signal RM1 may be enabled while the first chip 1 is in the read mode. The first read mode signal RM1 may be outputted from the control chip 3 or may be provided by an external device. A logic level of the first read mode signal RM1, which is enabled, may be set to be different according to the embodiments. The first output circuit 15 may output the first read data RD1 as the first selection read data SRD1 if the first read mode signal RM1 is enabled. A configuration and an operation of the first output circuit 15 will be described with reference to FIG. 2 later.

The second selection circuit 16 may generate a first selection write strobe signal SWS1 in response to a first write strobe signal WS1 and a second write strobe signal WS2. The second selection circuit 16 may receive the first write strobe signal WS1 through the third pad 12 and may receive the second write strobe signal WS2 through the fourth pad 13, while the first chip 1 is in the write mode. The second selection circuit 16 may select and output the first write strobe signal WS1 as the first selection write strobe signal SWS1 if the first write strobe signal WS1 is inputted to the second selection circuit 16 while the first chip 1 is in the write mode. The second selection circuit 16 may select and output the second write strobe signal WS2 as the first selection write strobe signal SWS1 if the second write strobe signal WS2 is inputted to the second selection circuit 16 while the first chip 1 is in the write mode.

The second output circuit 17 may generate a first selection read strobe signal SRS1 from a first read strobe signal RS1 in response to the first read mode signal RM1. The second output circuit 17 may output the first read strobe signal RS1 as the first selection read strobe signal SRS1 if the first read mode signal RM1 is enabled. A configuration and an operation of the second output circuit 17 will be described with reference to FIG. 3 later.

The first transceiver 18 may generate transmission data TD from the first selection write data SWD1 in response to a first write mode signal WM1. The first write mode signal WM1 may be enabled while the first chip 1 is in the write mode. The first write mode signal WM1 may be outputted from the control chip 3 or may be provided by an external device. A logic level of the first write mode signal WM1, which is enabled, may be set to be different according to the embodiments. The first transceiver 18 may output the first selection write data SWD1 as the transmission data TD if the first write mode signal WM1 is enabled. The first transceiver 18 may generate the first read data RD1 from the transmission data TD in response to the first read mode signal RM1. The first transceiver 18 may receive the transmission data TD to output the transmission data TD as the first read data RD1 if the first read mode signal RM1 is enabled. A configuration and an operation of the first transceiver 18 will be described with reference to FIG. 4 later.

The second transceiver 19 may generate a transmission strobe signal TS from the first selection write strobe signal SWS1 in response to the first write mode signal WM1. The second transceiver 19 may output the first selection write strobe signal SWS1 as the transmission strobe signal TS if the first write mode signal WM1 is enabled. The second transceiver 19 may generate the first read strobe signal RS1 from the transmission strobe signal TS in response to the first read mode signal RM1. The second transceiver 19 may receive the transmission strobe signal TS to output the transmission strobe signal TS as the first read strobe signal RS1 if the first read mode signal RM1 is enabled. A configuration and an operation of the second transceiver 19 will be described with reference to FIG. 5 later.

The second chip 2 may include a fifth pad 20, a sixth pad 21, a seventh pad 22, an eighth pad 23, a third selection circuit 24, a third output circuit 25, a fourth selection circuit 26, a fourth output circuit 27, a third transceiver 28 and a fourth transceiver 29.

The third selection circuit 24 may generate second selection write data SWD2 in response to third write data WD3 and fourth write data WD4. The third selection circuit 24 may receive the third write data WD3 through the fifth pad 20 and may receive the fourth write data WD4 through the sixth pad 21, while the second chip 2 is in the write mode. The third selection circuit 24 may select and output the third write data WD3 as the second selection write data SWD2 if the third write data WD3 are inputted to the third selection circuit 24 while the second chip 2 is in the write mode. The third selection circuit 24 may select and output the fourth write data WD4 as the second selection write data SWD2 if the fourth write data WD4 are inputted to the third selection circuit 24 while the second chip 2 is in the write mode.

The third output circuit 25 may generate second selection read data SRD2 from second read data RD2 in response to a second read mode signal RM2. The second read mode signal RM2 may be enabled while the second chip 2 is in the read mode. The second read mode signal RM2 may be outputted from the control chip 3 or may be provided by an external device. A logic level of the second read mode signal RM2, which is enabled, may be set to be different according to the embodiments. The third output circuit 25 may output the second read data RD2 as the second selection read data SRD2 if the second read mode signal RM2 is enabled.

The fourth selection circuit 26 may generate a second selection write strobe signal SWS2 in response to a third write strobe signal WS3 and a fourth write strobe signal WS4. The fourth selection circuit 26 may receive the third write strobe signal WS3 through the seventh pad 22 and may receive the fourth write strobe signal WS4 through the eighth pad 23, while the second chip 2 is in the write mode. The fourth selection circuit 26 may select and output the third write strobe signal WS3 as the second selection write strobe signal SWS2 if the third write strobe signal WS3 is inputted to the fourth selection circuit 26 while the second chip 2 is in the write mode. The fourth selection circuit 26 may select and output the fourth write strobe signal WS4 as the second selection write strobe signal SWS2 if the fourth write strobe signal WS4 is inputted to the fourth selection circuit 26 while the second chip 2 is in the write mode.

The fourth output circuit 27 may generate a second selection read strobe signal SRS2 from a second read strobe signal RS2 in response to the second read mode signal RM2. The fourth output circuit 27 may output the second read strobe signal RS2 as the second selection read strobe signal SRS2 if the second read mode signal RM2 is enabled.

The third transceiver 28 may generate the transmission data TD from the second selection write data SWD2 in response to a second write mode signal WM2. The second write mode signal WM2 may be enabled while the second chip 2 is in the write mode. The third transceiver 28 may output the second selection write data SWD2 as the transmission data TD if the second write mode signal WM2 is enabled. The third transceiver 28 may generate the second read data RD2 from the transmission data TD in response to the second read mode signal RM2. The third transceiver 28 may receive the transmission data TD to output the transmission data TD as the second read data RD2 if the second read mode signal RM2 is enabled.

The fourth transceiver 29 may generate the transmission strobe signal TS from the second selection write strobe signal SWS2 in response to the second write mode signal WM2. The fourth transceiver 29 may output the second selection write strobe signal SWS2 as the transmission strobe signal TS if the second write mode signal WM2 is enabled. The fourth transceiver 29 may generate the second read strobe signal RS2 from the transmission strobe signal TS in response to the second read mode signal RM2. The fourth transceiver 29 may receive the transmission strobe signal TS to output the transmission strobe signal TS as the second read strobe signal RS2 if the second read mode signal RM2 is enabled.

The control chip 3 may transmit signals to the first and second chips 1 and 2 through a first transmission line TL1, a second transmission line TL2, a third transmission line TL3 and a fourth transmission line TL4. The control chip 3 may receive signals from the first and second chips 1 and 2 through the first to fourth transmission lines TL1, TL2, TL3 and TL4. An operation performed to transmit signals between the control chip 3 and the first and second chips 1 and 2 will be described with reference to FIGS. 6 to 9 later.

Figure 2:
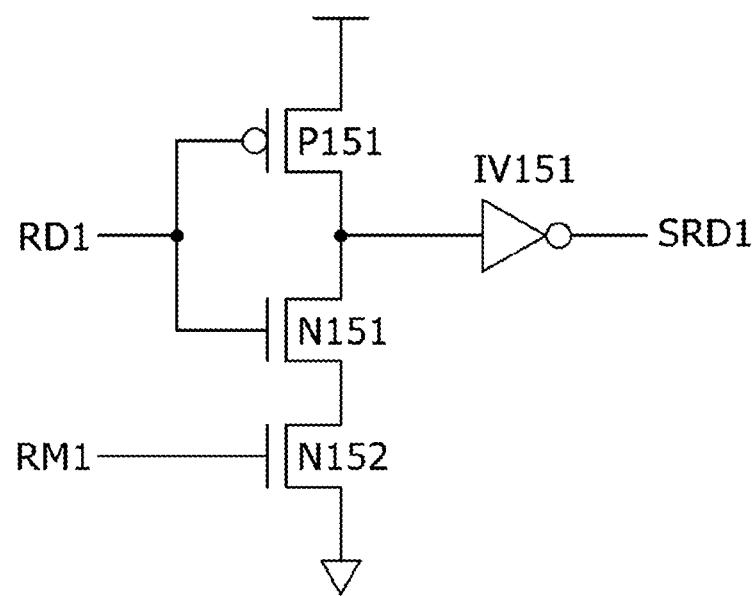
FIG. 2 is a circuit diagram illustrating an example of a first output circuit included in the package module of FIG. 1.

FIG. 2 illustrates a circuit diagram of an example of the first output circuit 15. Referring to FIG. 2, the first output circuit 15 may include a PMOS transistor P151, NMOS transistors N151 and N152, and an inverter IV151. The first output circuit 15 may buffer the first read data RD1 to output the buffered first read data as the first selection read data SRD1 if the first read mode signal RM1 is enabled to have a logic "high" level while the first chip 1 is in the read mode.

Figure 3:
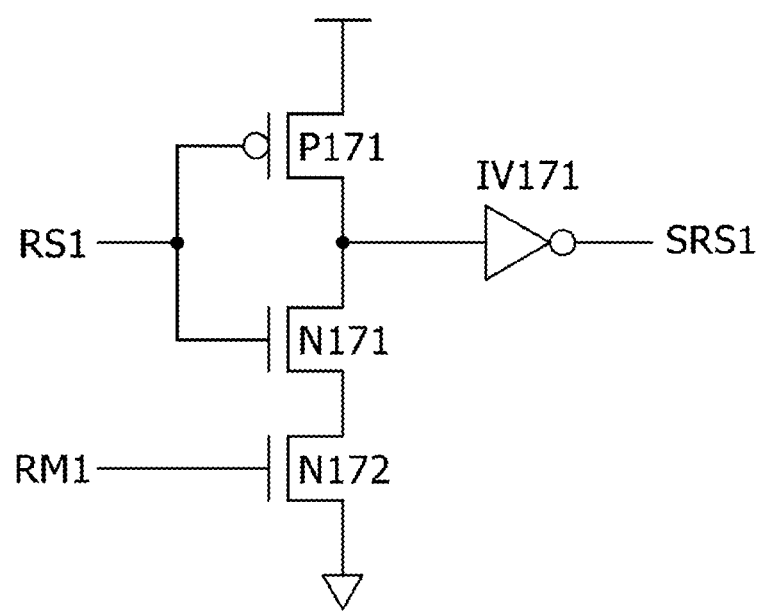
FIG. 3 is a circuit diagram illustrating an example of a second output circuit included in the package module of FIG. 1.

FIG. 3 illustrates a circuit diagram of an example of the second output circuit 17. Referring to FIG. 3, the second output circuit 17 may include a PMOS transistor P171, NMOS transistors N171 and N172, and an inverter IV171. The second output circuit 17 may buffer the first read strobe signal RS1 to output the buffered first read strobe signal as the first selection read strobe signal SRS1 if the first read mode signal RM1 is enabled to have a logic "high" level while the first chip 1 is in the read mode.

Figure 4:
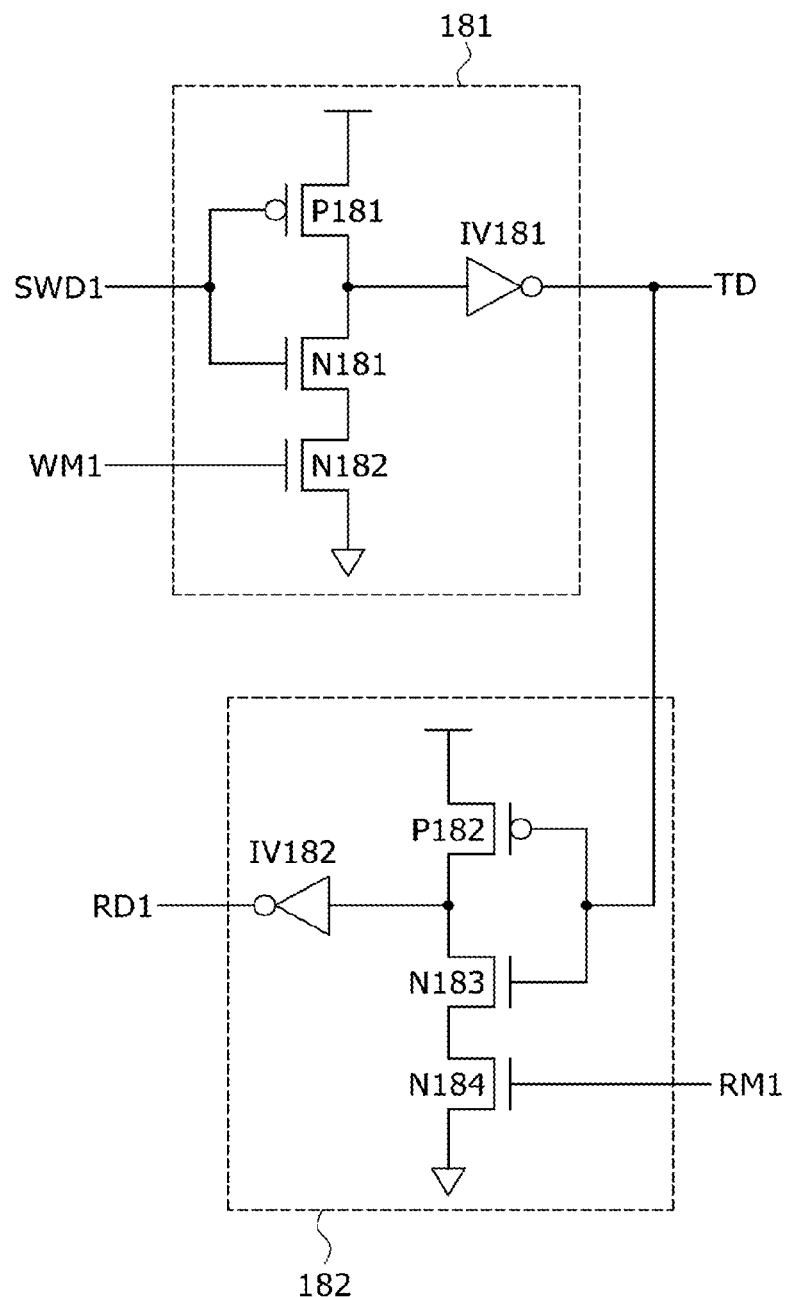
FIG. 4 is a circuit diagram illustrating an example of a first transceiver included in the package module of FIG. 1.

FIG. 4 illustrates a circuit diagram of an example of the first transceiver 18. Referring to FIG. 4, the first transceiver 18 may include a first transmitter 181 and a first receiver 182.

The first transmitter 181 may include a PMOS transistor P181, NMOS transistors N181 and N182, and an inverter IV181. The first transmitter 181 may buffer the first selection write data SWD1 to output the buffered first selection write data as the transmission data TD if the first write mode signal WM1 is enabled to have a logic "high" level while the first chip 1 is in the write mode.

The first receiver 182 may include a PMOS transistor P182, NMOS transistors N183 and N184, and an inverter IV182. The first receiver 182 may buffer the transmission data TD to output the buffered transmission data as the first read data RD1 if the first read mode signal RM1 is enabled to have a logic "high" level while the first chip 1 is in the read mode.

Figure 5:
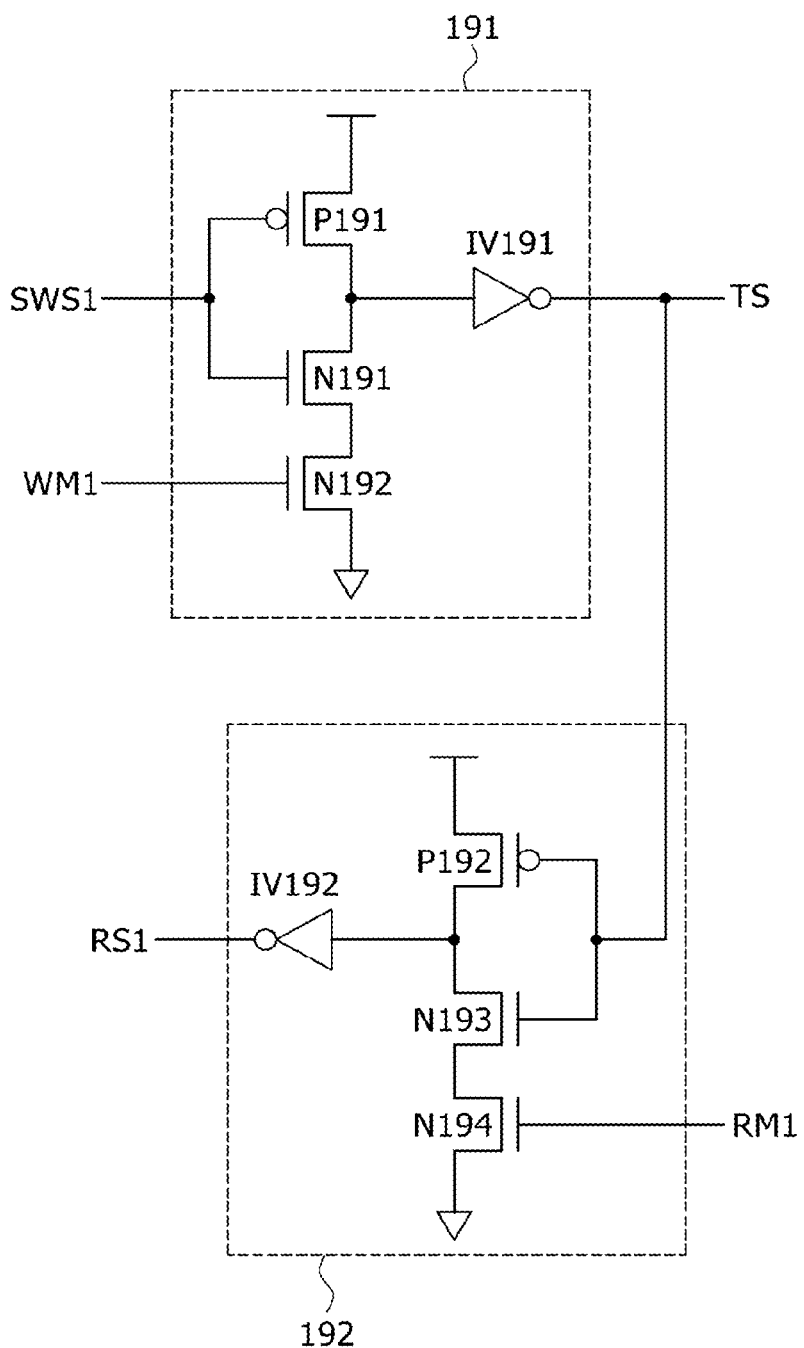
FIG. 5 is a circuit diagram illustrating an example of a second transceiver included in the package module of FIG. 1.

FIG. 5 illustrates a circuit diagram of an example of the second transceiver 19. Referring to FIG. 5, the second transceiver 19 may include a second transmitter 191 and a second receiver 192.

The second transmitter 191 may include a PMOS transistor P191, NMOS transistors N191 and N192, and an inverter IV191. The second transmitter 191 may buffer the first selection write strobe signal SWS1 to output the buffered first selection write strobe signal as the transmission strobe signal TS if the first write mode signal WM1 is enabled to have a logic "high" level while the first chip 1 is in the write mode.

The second receiver 192 may include a PMOS transistor P192, NMOS transistors N193 and N194, and an inverter IV192. The second receiver 192 may buffer the transmission strobe signal TS to output the buffered transmission strobe signal as the first read strobe signal RS1 if the first read mode signal RM1 is enabled to have a logic "high" level while the first chip 1 is in the read mode.

Figure 6:
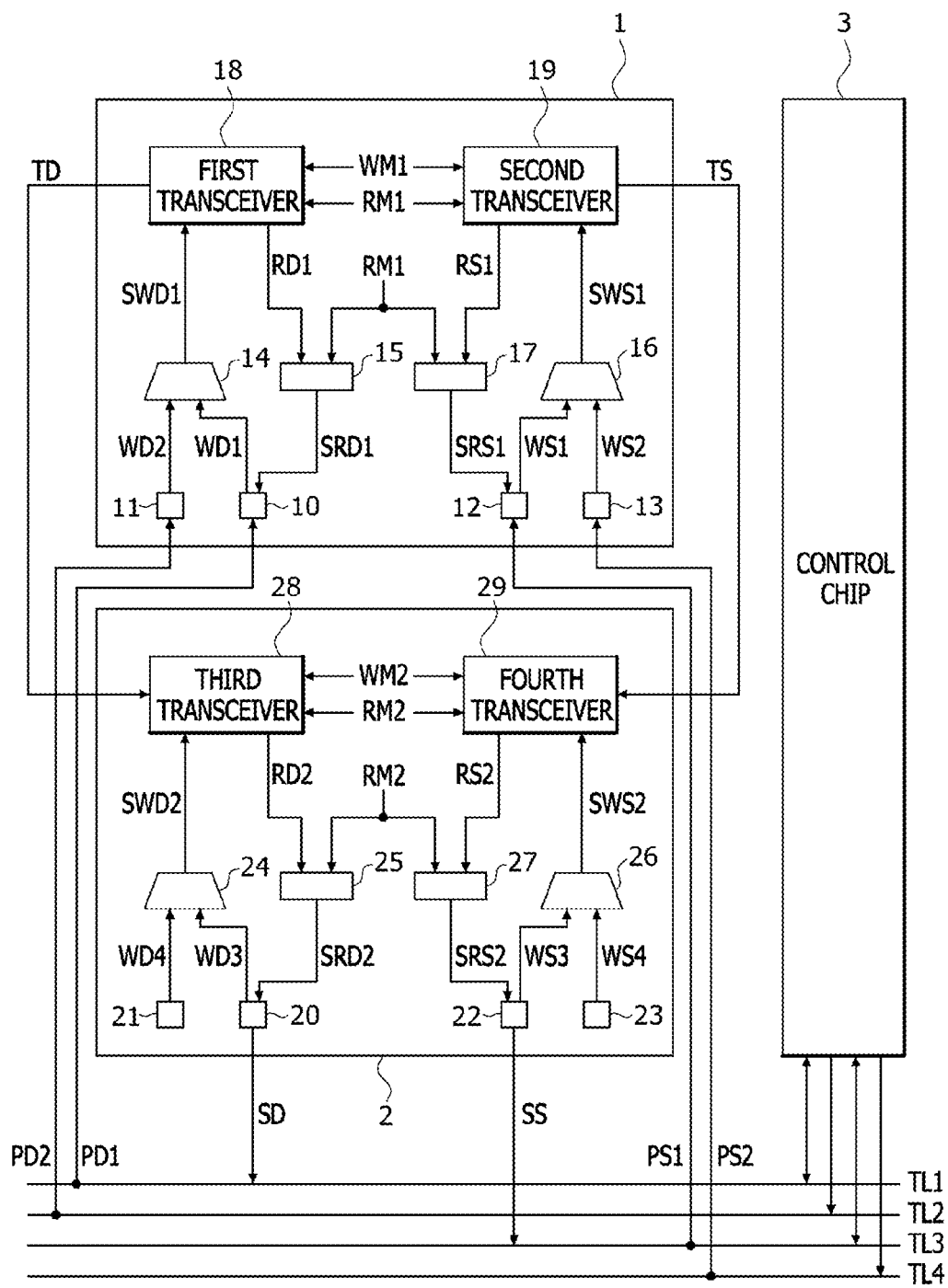
FIG. 6 is a block diagram illustrating a configuration of a package module including a first chip in a write mode and a second chip in a read mode.
Figure 7:
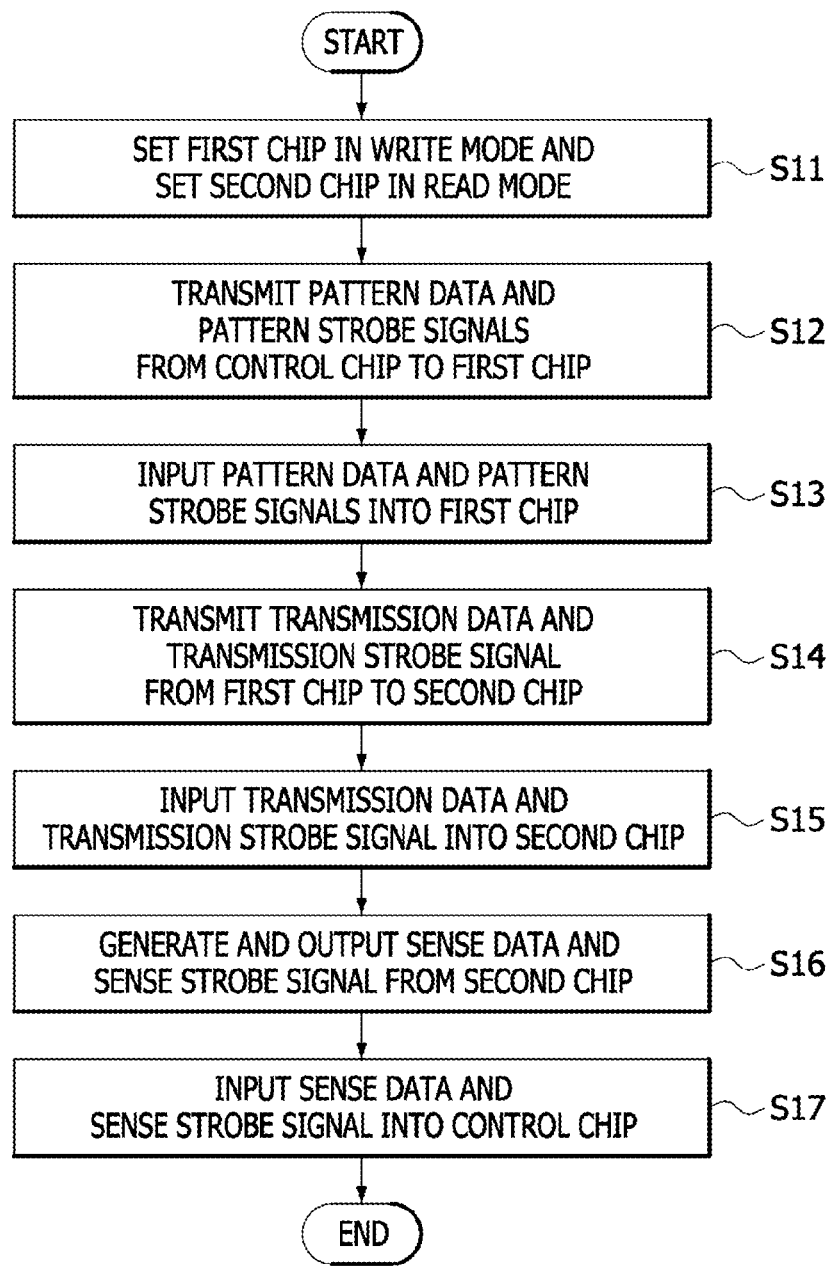
FIG. 7 is a flowchart illustrating an operation of the package module illustrated in FIG. 6.

Operation of the package module including the first chip 1 set in the write mode and the second chip 2 set in the read mode will be described hereinafter with reference to FIGS. 6 and 7.

If the first write mode signal WM1 is enabled to have a logic "high" level and the first read mode signal RM1 is disabled to have a logic "low" level, the first chip 1 may be set to operate in the write mode (see a step S11). If the second write mode signal WM2 is disabled to have a logic "low" level and the second read mode signal RM2 is enabled to have a logic "high" level, the second chip 2 may be set to operate in the read mode (see the step S11).

The control chip 3 may transmit first pattern data PD1, second pattern data PD2, a first pattern strobe signal PS1 and a second pattern strobe signal PS2 to the first chip 1 (see a step S12). The control chip 3 may transmit the first pattern data PD1 to the first chip 1 through the first transmission line TL1. The control chip 3 may transmit the second pattern data PD2 to the first chip 1 through the second transmission line TL2. The control chip 3 may transmit the first pattern strobe signal PS1 to the first chip 1 through the third transmission line TL3. The control chip 3 may transmit the second pattern strobe signal PS2 to the first chip 1 through the fourth transmission line TL4.

The first chip 1 may receive the first pattern data PD1, the second pattern data PD2, the first pattern strobe signal PS1 and the second pattern strobe signal PS2 from the control chip 3 through the first pad 10, the second pad 11, the third pad 12 and the fourth pad 13 (see a step S13). The first chip 1 may receive the first pattern data PD1 through the first transmission line TL1 and the first pad 10. The first chip 1 may receive the second pattern data PD2 through the second transmission line TL2 and the second pad 11. The first chip 1 may receive the first pattern strobe signal PS1 through the third transmission line TL3 and the third pad 12. The first chip 1 may receive the second pattern strobe signal PS2 through the fourth transmission line TL4 and the fourth pad 13.

The first chip 1 may generate the transmission data TD from the first and second pattern data PD1 and PD2 and may generate the transmission strobe signal TS from the first and second pattern strobe signals PS1 and PS2. The first chip 1 may transmit the transmission data TD and the transmission strobe signal TS to the second chip 2 (see a step S14). The first transceiver 18 of the first chip 1 may generate the transmission data TD from the first selection write data SWD1 and may transmit the transmission data TD to the second chip 2. The second transceiver 19 of the first chip 1 may generate the transmission strobe signal TS from the first selection write strobe signal SWS1 and may transmit the transmission strobe signal TS to the second chip 2.

The second chip 2 may receive the transmission data TD and the transmission strobe signal TS from the first chip 1 (see a step S15). The third transceiver 28 of the second chip 2 may receive the transmission data TD to generate the second read data RD2. The fourth transceiver 29 of the second chip 2 may receive the transmission strobe signal TS to generate the second read strobe signal RS2.

The second chip 2 may generate sense data SD and a sense strobe signal SS from the second read data RD2 and the second read strobe signal RS2 and may output the sense data SD and the sense strobe signal SS (see a step S16). The second chip 2 may buffer the second read data RD2 to generate the sense data SD and may output the sense data SD through the fifth pad 20. The second chip 2 may buffer the second read strobe signal RS2 to generate the sense strobe signal SS and may output the sense strobe signal SS through the seventh pad 22.

The control chip 3 may receive the sense data SD and the sense strobe signal SS from the second chip 2 (see a step S17). The control chip 3 may receive the sense data SD through the first transmission line TL1 and may compare the sense data SD with the first and second pattern data PD1 and PD2 to discriminate whether the first transceiver 18 of the first chip 1 has a normal transmitting function and the third transceiver 28 of the second chip 2 has a normal receiving function. The control chip 3 may receive the sense strobe signal SS through the third transmission line TL3 and may compare the sense strobe signal SS with the first and second pattern strobe signals PS1 and PS2 to discriminate whether the second transceiver 19 of the first chip 1 has a normal transmitting function and the fourth transceiver 29 of the second chip 2 has a normal receiving function.

Figure 8:
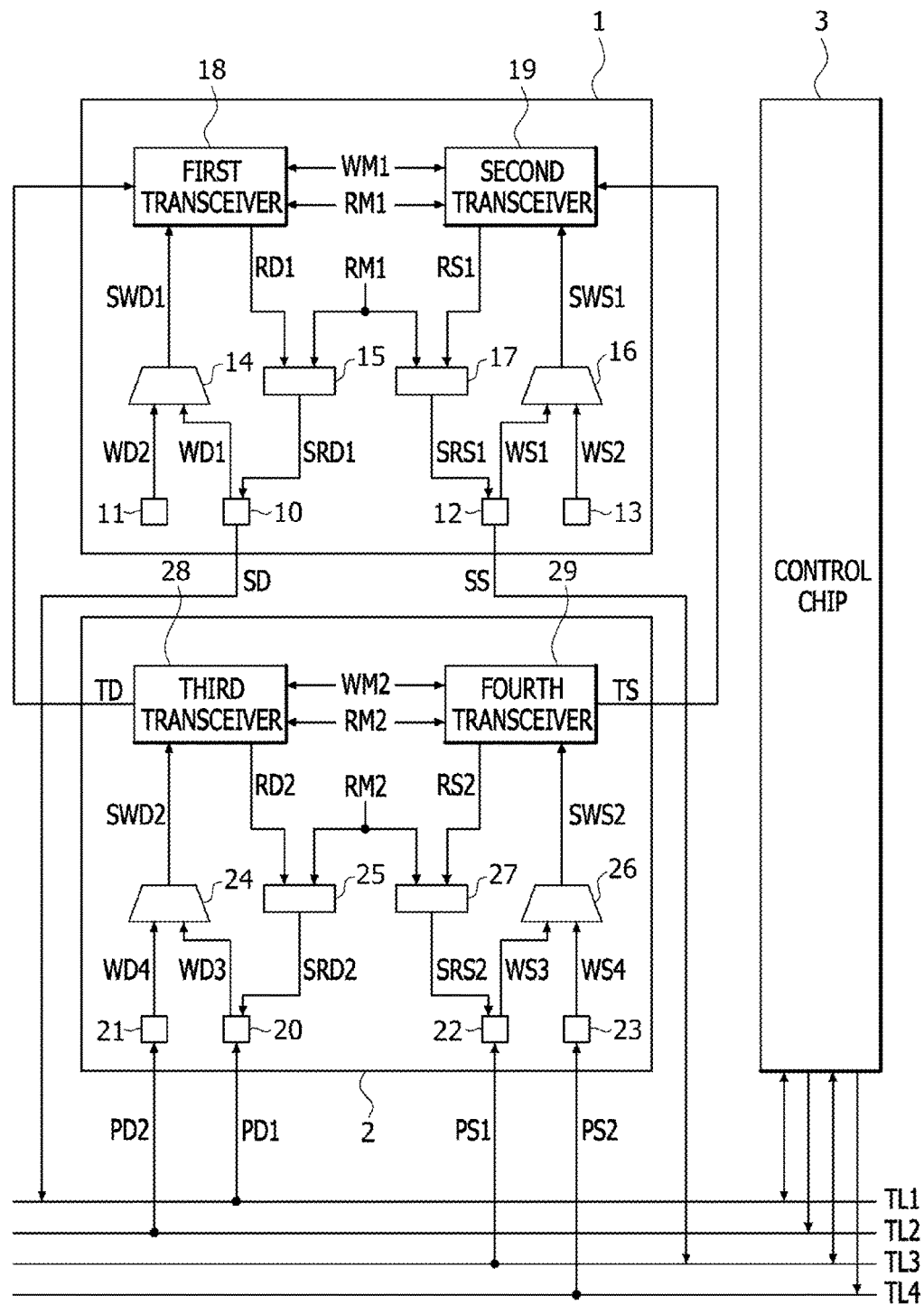
FIG. 8 is a block diagram illustrating a configuration of a package module including a first chip in a read mode and a second chip in a write mode.
Figure 9:
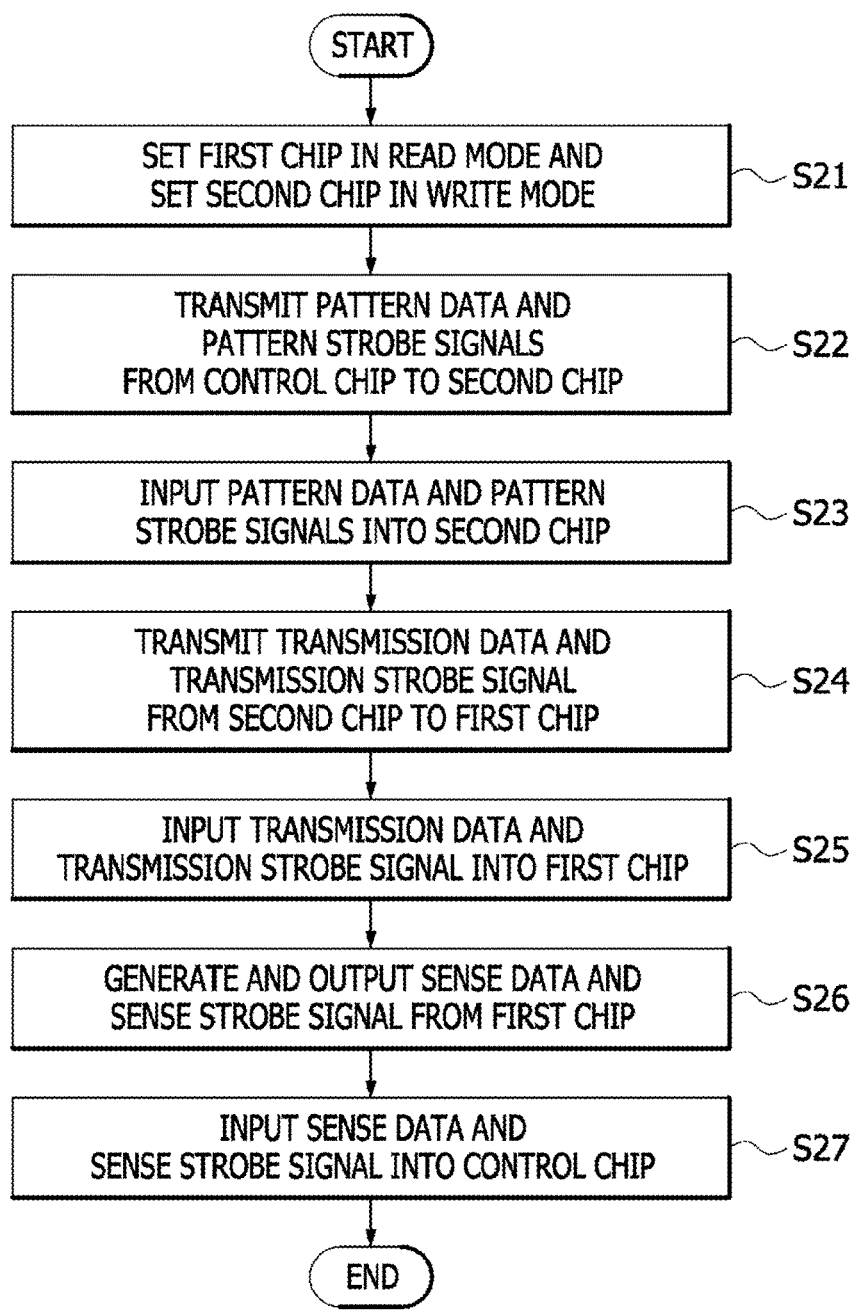
FIG. 9 is a flowchart illustrating an operation of the package module illustrated in FIG. 8.

Operation of the package module including the first chip 1 set in the read mode and the second chip 2 set in the write mode will be described hereinafter with reference to FIGS. 8 and 9.

If the second write mode signal WM2 is enabled to have a logic "high" level and the second read mode signal RM2 is disabled to have a logic "low" level, the second chip 2 may be set to operate in the write mode (see a step S21). If the first write mode signal WM1 is disabled to have a logic "low" level and the first read mode signal RM1 is enabled to have a logic "high" level, the first chip 1 may be set to operate in the read mode (see the step S21).

The control chip 3 may transmit the first pattern data PD1, the second pattern data PD2, the first pattern strobe signal PS1 and the second pattern strobe signal PS2 to the second chip 2 (see a step S22). The control chip 3 may transmit the first pattern data PD1 to the second chip 2 through the first transmission line TL1. The control chip 3 may transmit the second pattern data PD2 to the second chip 2 through the second transmission line TL2. The control chip 3 may transmit the first pattern strobe signal PS1 to the second chip 2 through the third transmission line TL3. The control chip 3 may transmit the second pattern strobe signal PS2 to the second chip 2 through the fourth transmission line TL4.

The second chip 2 may receive the first pattern data PD1, the second pattern data PD2, the first pattern strobe signal PS1 and the second pattern strobe signal PS2 from the control chip 3 through the fifth pad 20, the sixth pad 21, the seventh pad 22 and the eighth pad 23 (see a step S23). The second chip 2 may receive the first pattern data PD1 through the first transmission line TL1 and the fifth pad 20. The second chip 2 may receive the second pattern data PD2 through the second transmission line TL2 and the sixth pad 21. The second chip 2 may receive the first pattern strobe signal PS1 through the third transmission line TL3 and the seventh pad 22. The second chip 2 may receive the second pattern strobe signal PS2 through the fourth transmission line TL4 and the eighth pad 23.

The second chip 2 may generate the transmission data TD from the first and second pattern data PD1 and PD2 and may generate the transmission strobe signal TS from the first and second pattern strobe signals PS1 and PS2. The second chip 2 may transmit the transmission data TD and the transmission strobe signal TS to the first chip 1 (see a step S24). The third transceiver 28 of the second chip 2 may generate the transmission data TD from the second selection write data SWD2 and may transmit the transmission data TD to the first chip 1. The fourth transceiver 29 of the second chip 2 may generate the transmission strobe signal TS from the second selection write strobe signal SWS2 and may transmit the transmission strobe signal TS to the first chip 1.

The first chip 1 may receive the transmission data TD and the transmission strobe signal TS from the second chip 2 (see a step S25). The first transceiver 18 of the first chip 1 may receive the transmission data TD to generate the first read data RD1. The second transceiver 19 of the first chip 1 may receive the transmission strobe signal TS to generate the first read strobe signal RS1.

The first chip 1 may generate the sense data SD and the sense strobe signal SS from the first read data RD1 and the first read strobe signal RS1 and may output the sense data SD and the sense strobe signal SS (see a step S26). The first chip 1 may buffer the first read data RD1 to generate the sense data SD and may output the sense data SD through the first pad 10. The first chip 1 may buffer the first read strobe signal RS1 to generate the sense strobe signal SS and may output the sense strobe signal SS through the third pad 12.

The control chip 3 may receive the sense data SD and the sense strobe signal SS from the first chip 1 (see a step S27). The control chip 3 may receive the sense data SD through the first transmission line TL1 and may compare the sense data SD with the first and second pattern data PD1 and PD2 to discriminate whether the third transceiver 28 of the second chip 2 has a normal transmitting function and the first transceiver 18 of the first chip 1 has a normal receiving function. The control chip 3 may receive the sense strobe signal SS through the third transmission line TL3 and may compare the sense strobe signal SS with the first and second pattern strobe signals PS1 and PS2 to discriminate whether the fourth transceiver 29 of the second chip 2 has a normal transmitting function and the second transceiver 19 of the first chip 1 has a normal receiving function.

As described above, the package module according to an embodiment may respectively set the first chip 1 and the second chip 2 in the write mode and the read mode to discriminate whether the first and second transceivers 18 and 19 included in the first chip 1 have a normal transmitting function and the third and fourth transceivers 28 and 29 included in the second chip 2 have a normal receiving function. In addition, the package module may respectively set the second chip 2 and the first chip 1 in the write mode and the read mode to discriminate whether the third and fourth transceivers 28 and 29 included in the second chip 2 have a normal transmitting function and the first and second transceivers 18 and 19 included in the first chip 1 have a normal receiving function. That is, the package module according to an embodiment may put the first chip 1 into a condition of the write mode and the second chip 2 into a condition of the read mode and may then put the second chip 2 into a condition of the write mode and the first chip 1 into a condition of the read mode, thereby discriminating whether all of the first to fourth transceivers 18, 19, 28 and 29 included in the first and second chips 1 and 2 have a normal transmitting function and a normal receiving function.

Figure 10:
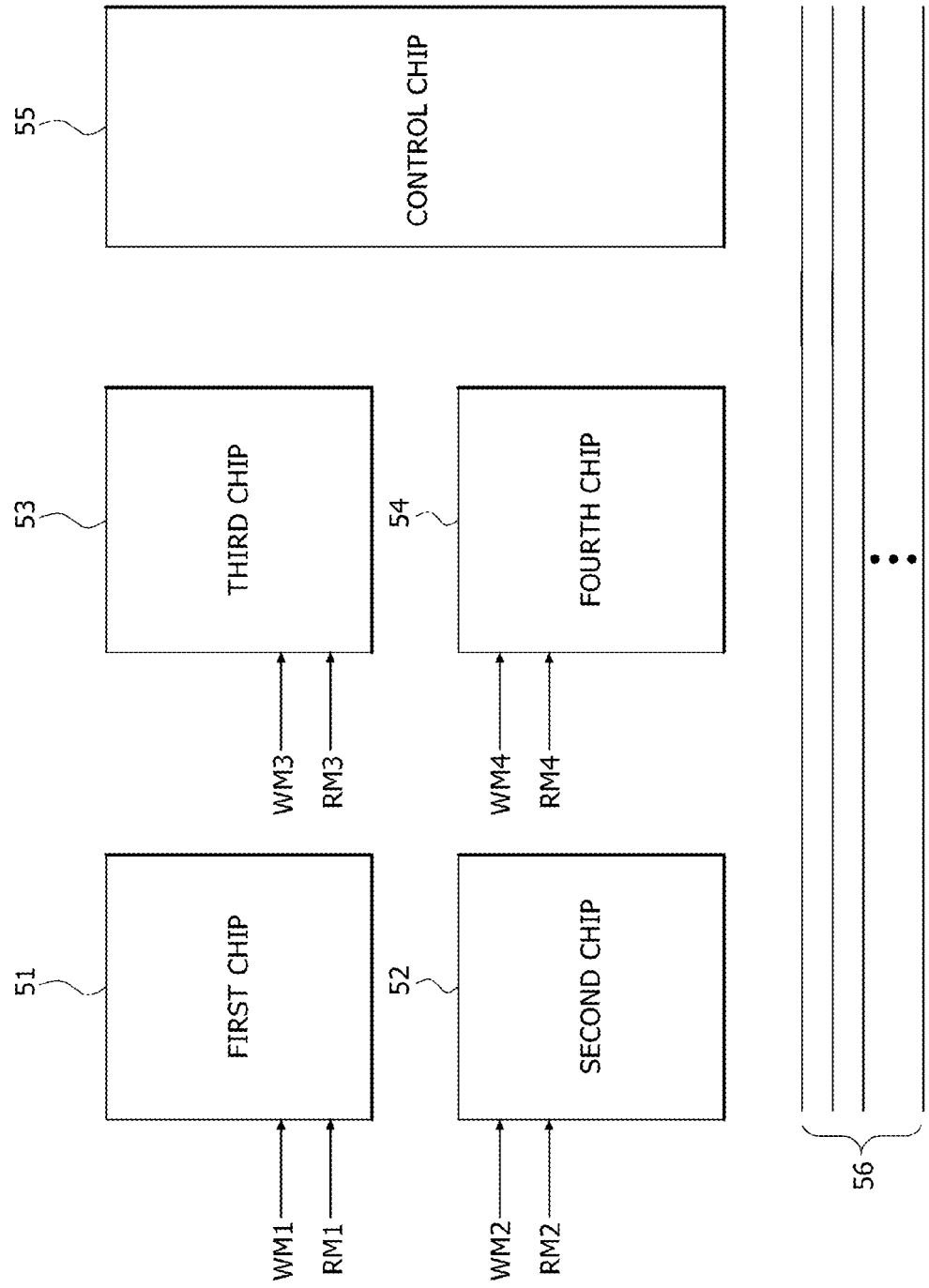
FIG. 10 is a block diagram illustrating a configuration of a package module according to an embodiment of the present disclosure.

Referring to FIG. 10, a package module according to another embodiment may include a first chip 51, a second chip 52, a third chip 53, a fourth chip 54, a control chip 55 and a transmission line group 56.

The first chip 51 may operate in a write mode or a read mode in response to a first write mode signal WM1 and a first read mode signal RM1. The first chip 51 may operate in the write mode if the first write mode signal WM1 is enabled. The first chip 51 may operate in the read mode if the first read mode signal RM1 is enabled.

The second chip 52 may operate in the write mode or the read mode in response to a second write mode signal WM2 and a second read mode signal RM2. The second chip 52 may operate in the write mode if the second write mode signal WM2 is enabled. The second chip 52 may operate in the read mode if the second read mode signal RM2 is enabled.

The third chip 53 may operate in the write mode or the read mode in response to a third write mode signal WM3 and a third read mode signal RM3. The third chip 53 may operate in the write mode if the third write mode signal WM3 is enabled. The third chip 53 may operate in the read mode if the third read mode signal RM3 is enabled.

The fourth chip 54 may operate in the write mode or the read mode in response to a fourth write mode signal WM4 and a fourth read mode signal RM4. The fourth chip 54 may operate in the write mode if the fourth write mode signal WM4 is enabled. The fourth chip 54 may operate in the read mode if the fourth read mode signal RM4 is enabled.

Each of the first to fourth chips 51, 52, 53 and 54 may be realized to have substantially the same configuration as the first chip 1 or the second chip 2 described with reference to FIG. 1.

The control chip 55 may transmit various signals and/or data to at least one of the first to fourth chips 51, 52, 53 and 54 through the transmission line group 56 or may receive signals and/or data from at least one of the first to fourth chips 51, 52, 53 and 54 through the transmission line group 56.

According to the package module illustrated in FIG. 10, a transmitting function and a receiving function of each of the first to fourth chips 51, 52, 53 and 54 may be tested by putting two chips of the first to fourth chips 51, 52, 53 and 54 into a condition of the write mode and putting the remaining chips of the first to fourth chips 51, 52, 53 and 54 into a condition of the read mode. For example, the package module illustrated in FIG. 10 may put the first and third chips 51 and 53 into a condition of the write mode and put the second and fourth chips 52 and 54 into a condition of the read mode to discriminate whether the first and third chips 51 and 53 have a normal transmitting function and the second and fourth chips 52 and 54 have a normal receiving function. In addition, the package module illustrated in FIG. 10 may put the second and fourth chips 52 and 54 into a condition of the write mode and put the first and third chips 51 and 53 into a condition of the read mode to discriminate whether the second and fourth chips 52 and 54 have a normal transmitting function and the first and third chips 51 and 53 have a normal receiving function.

Figure 11:
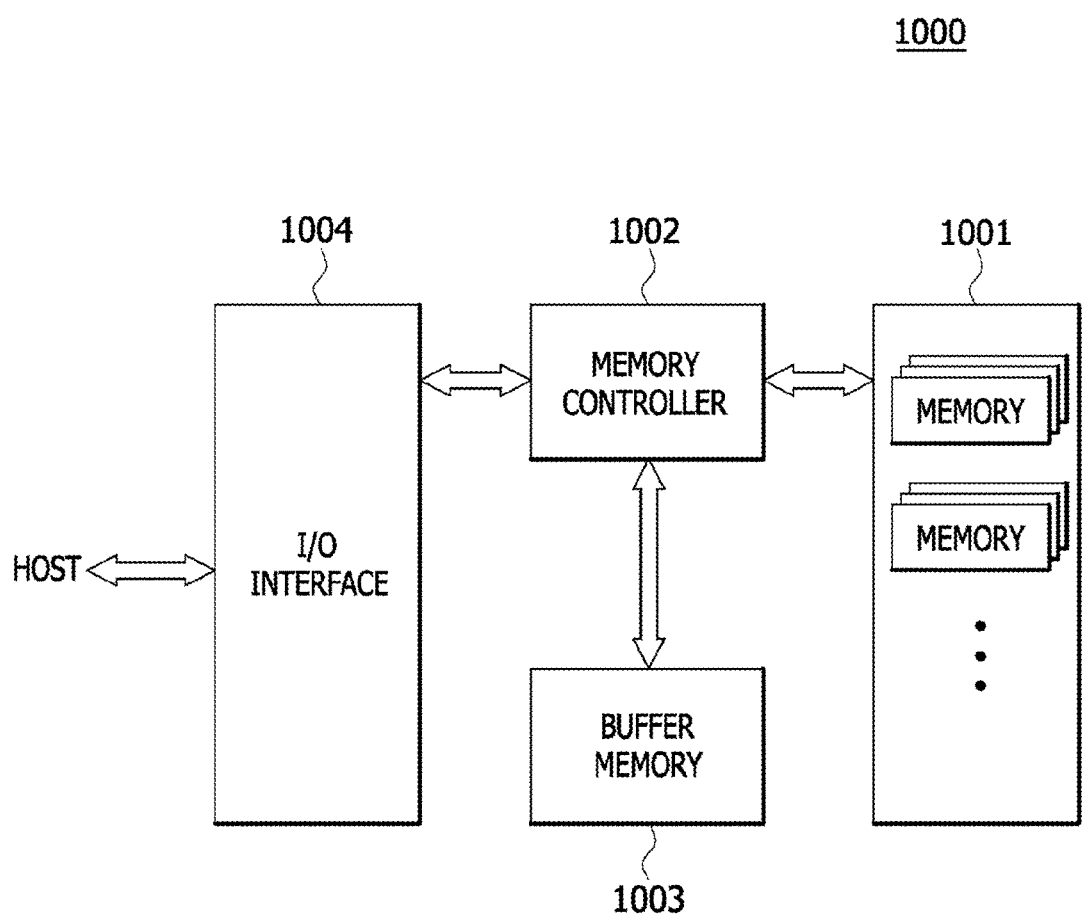
FIG. 11 is a block diagram illustrating a configuration of an electronic system employing at least one of the package modules illustrated in FIGS. 1 and 10.

At least one of the package modules described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include at least one of the package modules described with reference to FIGS. 1 to 10. The package module may include a plurality of chips. The package module may put at least one of the plurality of chips into a condition of a write mode and put the remaining chip(s) of the plurality of chips into a condition of a read mode to discriminate whether the chip(s) set in the write mode has a normal transmitting function and the chip(s) set in the read mode has a normal receiving function. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A package module comprising:
    a first chip configured to operate in a first write mode and receive pattern data; and
    a second chip configured to operate in a first read mode and output first sense data,
    wherein whether the first chip has a normal transmitting function and the second chip has a normal receiving function is determined based on a comparison between the pattern data and the first sense data, and
    wherein the first chip includes a first transceiver configured to generate first transmission data from selection write data and configured to output the first transmission data.

2. The package module of claim 1, further comprising a control chip configured to transmit first pattern data to the first chip and configured to receive the first sense data to discriminate whether the first chip has a normal transmitting function and the second chip has a normal receiving function.

3. The package module of claim 1, wherein the first chip further includes:
    a first pad receiving first pattern data to provide write data; and
    a first selection circuit configured to selectively output the write data as selection write data.

4. The package module of claim 3, wherein the second chip includes:
    a second transceiver configured to receive the first transmission data to generate read data;
    an output circuit configured to generate selection read data from the read data in the first read mode; and
    a second pad outputting the selection read data as the first sense data.

5. The package module of claim 1, wherein the first chip receives a first pattern strobe signal to generate and transmit a transmission strobe signal in the first write mode.

6. The package module of claim 5, wherein the second chip receives the transmission strobe signal to generate and transmit a sense strobe signal in the first read mode.

7. The package module of claim 6, further comprising a control chip configured to transmit the first pattern strobe signal to the first chip and configured to receive the sense strobe signal to discriminate whether the first chip has a normal transmitting function and the second chip has a normal receiving function.

8. The package module of claim 1, wherein the second chip receives second pattern data to generate and transmit second transmission data in a second write mode.

9. The package module of claim 8, wherein the second write mode is set after the first write mode and the first read mode terminate.

10. The package module of claim 8, wherein the first chip receives the second transmission data to generate and transmit second sense data in a second read mode.

11. The package module of claim 10, wherein the second read mode is set after the first write mode and the first read mode terminate.

12. The package module of claim 10, further comprising a control chip configured to transmit the second pattern data to the second chip and configured to receive the second sense data to discriminate whether the second chip has a normal transmitting function and the first chip has a normal receiving function.

13. A method of testing operations of chips, the method comprising:
    setting a first chip from a plurality of chips in a condition of a first write mode and a second chip from the plurality of chips in a condition of a first read mode;
    generating first transmission data from first pattern data inputted to the first chip;
    transmitting the first transmission data from the first chip to the second chip;
    generating first sense data from the first transmission data inputted to the second chip to output the first sense data from the second chip; and
    comparing the first sense data with the first pattern data to discriminate whether the first chip has a normal transmitting function and the second chip has a normal receiving function.

14. The method of claim 13, wherein generating the first transmission data includes:
    receiving the first pattern data to provide write data in the first chip;
    selecting the write data as selection write data in the first chip; and
    generating the first transmission data from the selection write data to transmit the first transmission data from the first chip to the second chip.

15. The method of claim 13, wherein generating the first sense data to output the first sense data from the second chip includes:
    receiving the first transmission data to provide read data in the second chip; and
    generating selection read data from the read data in the second chip to output the selection read data as the first sense data.

16. The method of claim 13, wherein generating the first sense data to output the first sense data from the second chip is followed by setting the second chip in a condition of a second write mode and the first chip in a condition of a second read mode.

17. The method of claim 16, wherein the second write mode and the second read mode are set after the first write mode and the first read mode terminate.

18. The method of claim 16, wherein putting the second chip in a condition of the second write mode and the first chip in a condition of the second read mode is followed by:
    generating second transmission data from second pattern data inputted to the second chip;
    transmitting the second transmission data from the second chip to the first chip; and
    generating second sense data from the second transmission data inputted to the first chip to output the second sense data from the first chip.

19. The method of claim 18, further comprising comparing the second sense data with the second pattern data to discriminate whether the second chip has a normal transmitting function and the first chip has a normal receiving function.

20. A package module comprising:
- a first chip configured to operate in a write mode and receive a pattern strobe signal; and
- a second chip configured to operate in a read mode and output a sense strobe signal,
- wherein whether the first chip has a normal transmitting function and the second chip has a normal receiving function is determined based on a comparison between the pattern strobe signal and the sense strobe signal, and
- wherein the first chip includes a first transceiver configured to generate first transmission data from selection write data and configured to output the first transmission data.

* * * * *